(12) United States Patent
Nakano et al.

(10) Patent No.: US 7,907,390 B2
(45) Date of Patent: Mar. 15, 2011

(54) CIRCUIT DEVICE

(75) Inventors: Shin-ya Nakano, Gifu (JP); Yoh Takano, Gifu (JP); Tetsuro Sawai, Hashima (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 610 days.

(21) Appl. No.: 11/693,316

(22) Filed: Mar. 29, 2007

(65) Prior Publication Data

US 2007/0230078 A1    Oct. 4, 2007

(30) Foreign Application Priority Data

Mar. 31, 2006 (JP) ................. 2006-098418
Jan. 31, 2007 (JP) ................. 2007-021274

(51) Int. Cl.
*H01L 23/34* (2006.01)
*H05K 5/00* (2006.01)
*H05K 7/00* (2006.01)

(52) U.S. Cl. ............... 361/679.01; 257/713; 361/704

(58) Field of Classification Search ........ 361/704, 361/679.01; 257/713
See application file for complete search history.

(56) References Cited

U.S. PATENT DOCUMENTS

| 3,965,481 | A * | 6/1976 | Esser ................ 257/224 |
| 6,953,712 | B2 * | 10/2005 | Usui et al. ........ 257/E23.077 |
| 7,187,060 | B2 * | 3/2007 | Usui .................... 257/659 |
| 7,199,496 | B2 * | 4/2007 | Suzuki et al. ............ 310/52 |
| 2004/0140551 | A1 * | 7/2004 | Usui et al. .............. 257/700 |
| 2004/0152234 | A1 * | 8/2004 | Usui et al. .............. 438/106 |
| 2005/0161682 | A1 * | 7/2005 | Mazzochette et al. ..... 257/79 |
| 2006/0032049 | A1 * | 2/2006 | Usui et al. ................ 29/825 |

FOREIGN PATENT DOCUMENTS

JP        11-074452        3/1999

* cited by examiner

*Primary Examiner* — Jayprakash N Gandhi
*Assistant Examiner* — Adrian S Wilson
(74) *Attorney, Agent, or Firm* — Fish & Richardson P.C.

(57) ABSTRACT

A circuit device includes a metal substrate; and a plurality of circuit elements, mounted on the metal substrate, which electrically connects to the metal substrate. The metal substrate is made of a copper plate of high thermal conductivity. The metal substrate is demarcated into a plurality of sections by insulating films added with a filler for enhancing the thermal conductivity in resin. The circuit elements, which have respective independent operating potentials on a side of the metal substrate of the circuit elements, are respectively provided on separated copper plates.

19 Claims, 15 Drawing Sheets

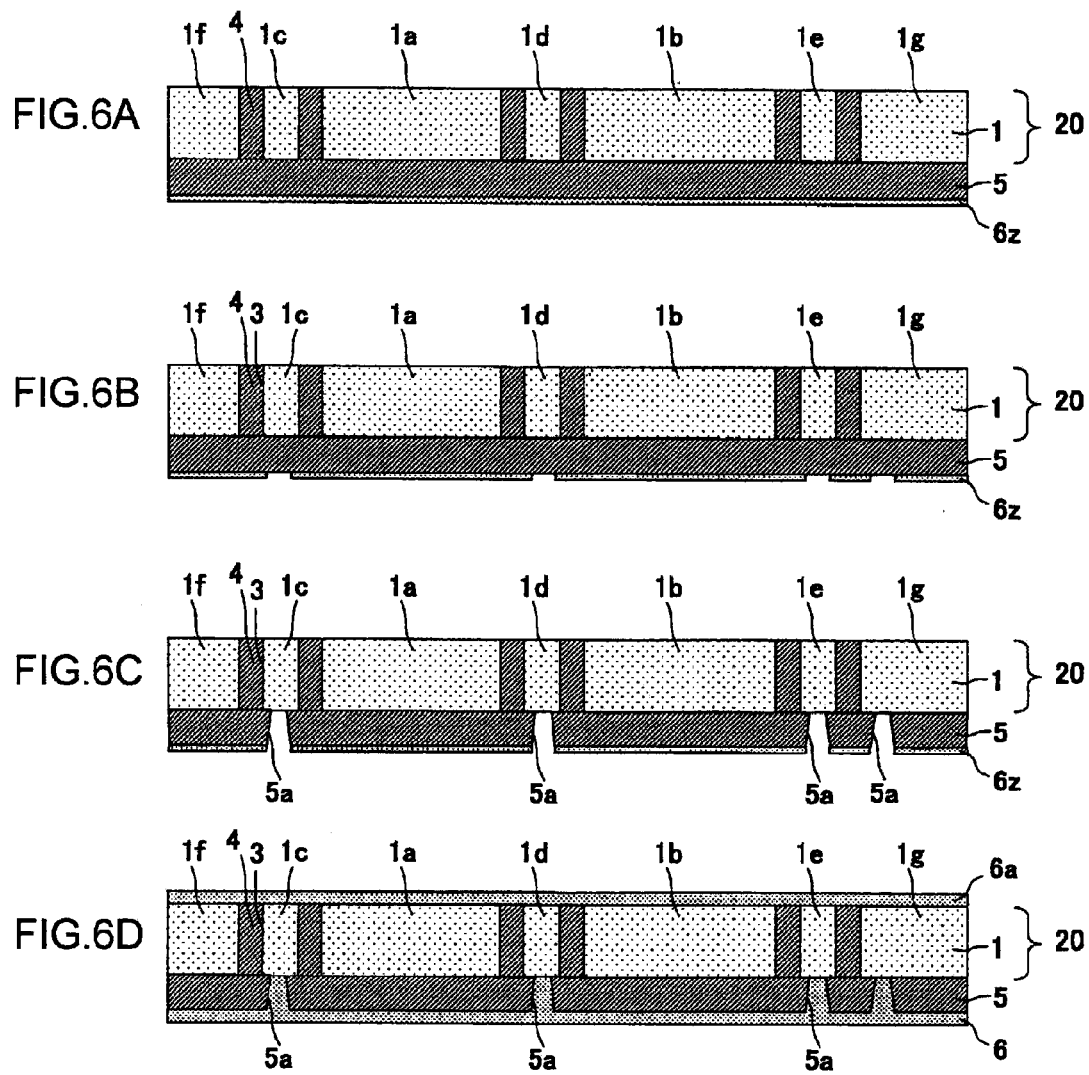

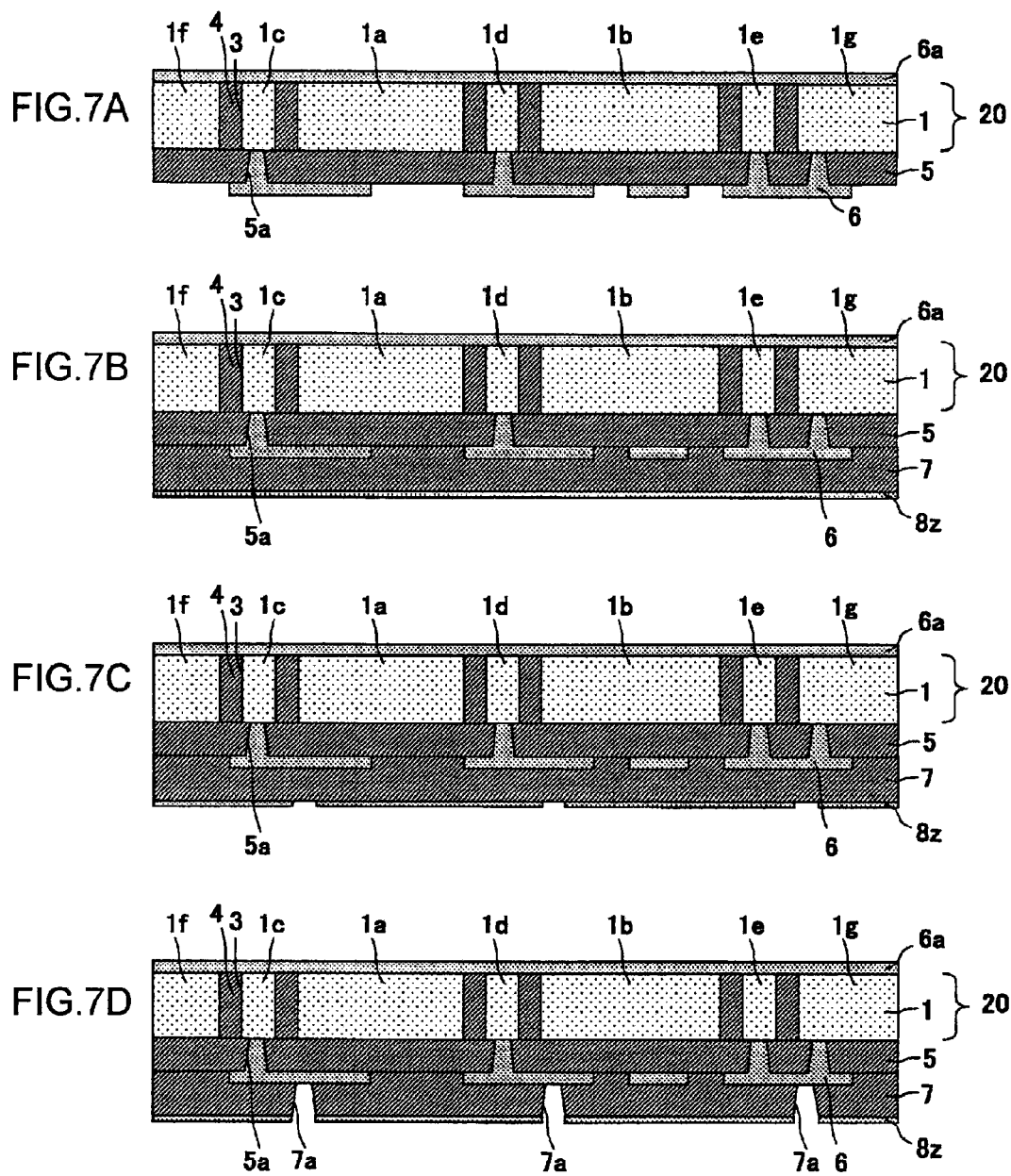

CIRCUIT DEVICE

BACKGROUND OF THE INVENTION

1. Field of the Invention

The present invention relates to a circuit device and, more particularly, to a circuit device using a metal substrate.

2. Description of the Related Art

In recent years, as circuit devices incorporated in electronic equipment and the like have become smaller in size, higher-density and more functionally-sophisticated (e.g., multi-functional), the heat generation density per unit volume of a circuit device has been on the rise. To cope with this trend, metal substrates, which excel in their heat release performance, are today often used as substrates for the circuit devices, and at the same time circuit elements, such as ICs (Integrated Circuits) or LSIs (Large Scale Integrated Circuits) are mounted on such metal substrates (See Reference (1) in the following Related Art List, for instance).

FIG. 10 is a sectional view schematically illustrating a structure of a conventional circuit device as disclosed in Reference (1). In FIG. 10, a metal base plate 103 provided with a first insulating layer 104 and a first circuit pattern 105 on the top thereof constitutes a metal substrate 120. Power elements 106 are disposed on the metal base plate 103 through the intermediary of the first insulating layer 104 and the first circuit pattern 105. The power elements 106 and the first circuit pattern 105 are electrically connected with each other via wires 107. Further, in such a conventional circuit device, the metal base plate 103 is divided into regions thereof, on each of which a power element 106 and a first circuit pattern 105 connected thereto are disposed, and a second insulating layer 108 is disposed between the adjacent regions.

3. Related Art List (1) Japanese Patent Application Laid-Open No. Hei11-074452.

In the above-cited conventional structure, a plurality of power elements 106 are each disposed on a metal base plate 103 through a first insulating layer 104. Accordingly, the heat generated by a power element 106 is released to the metal base plate 103 through the first insulating layer 104 which is in the region where the power element 106 is mounted. However, a problem in this setup is that because of a large thermal resistance of the first insulating layer 104, the heat generated by the power element 106 is not sufficiently released to the metal base plate 103.

Another problem in this setup is that heat is also generated at a portion of the first circuit pattern (pad electrode portion), which is connected to a power element 106 via a wire 107, but because of a large thermal resistance of the first insulating layer 104 located thereunder, the heat generated is not sufficiently released to the metal base plate 103.

SUMMARY OF THE INVENTION

The present invention has been made in view of the foregoing circumstances, and a general purpose thereof is to provide a circuit device which features a superior heat release performance.

In order to achieve the above purpose, a circuit device according to one embodiment of the present invention comprises: a metal substrate which is sectioned into a plurality of regions by an insulating film; and a first circuit element and a second circuit element which are electrically connected with the metal substrate wherein the first circuit element and the second circuit element are mounted on one surface of the metal substrate, wherein a first voltage is applied to a connection part of the first circuit element connected with the metal substrate, a second voltage differing from the first voltage is applied to a connection part of the second circuit element connected with the metal substrate, and the first circuit element and the second circuit element are provided on different regions in the plurality of regions, respectively. Here, the circuit element is a semiconductor device represented by an LSI chip where elements are formed in particular on a silicon substrate, a SiGe substrate or a GaAs substrate. The circuit elements may be passive elements that form a passive element circuit on an $Al_2O_3$ substrate.

According to this embodiment, the circuit elements (the first circuit element and the second circuit element), which have mutually different voltages applied to the respective portions thereof connected to the metal substrate, can be disposed in an electrically-connected state on the metal substrate, so that the heat generated by the circuit elements may be directly conducted to the respective sections of the metal substrate (demarcated regions). This increases the heat release effect, thus enhancing the heat resistance reliability of the circuit device. The insulating film, which exists between the demarcated sections of the metal substrate, absorbs the expansion of the metal substrate caused by the heat conducted from the circuit elements. This reduces warping of the circuit device. Thereby, the drop of reliability of the circuit device due to the heat generated from the circuit elements can be reduced.

In the above-described structure, it is preferable that the first circuit element and the second circuit element be each mounted directly on the metal substrate. This structure helps the heat generated from the circuit elements (the first circuit element and the second circuit element) conduct to the metal substrate. This increases the heat release effect, thus further enhancing the heat resistance reliability of the circuit device.

In the above-described structure, it is preferable that the regions, on which the first circuit element and the second circuit element are mounted, have their outer edges in positions outside outer edges of the first circuit element and the circuit element, respectively. With this structure, the heat generated by the circuit elements are conducted uniformly into the metal substrate within the planes of the circuit elements, thus achieving effective heat release from the circuit elements.

In the above-described structure, the plurality of regions may include a region that functions as an electrode used for wire connection within the metal substrate. In such a case, the wires are directly connected to the regions used as wire connection electrodes, so that the heat generated in these connection portions are conducted directly to the metal substrate. This increases the heat release effect, thus further improving the heat resistance reliability of the circuit device.

In the above structure, the insulating film may be made of resin film added with a filler used to accelerate heat transfer. In this case, part of the heat conducted from a circuit element to a metal substrate directly below the circuit element, for instance, is further conducted to a metal substrate of a region adjacent thereto through the insulating film. This increases the heat release performance of a region (the demarcated metal substrate), on which the circuit elements are mounted, thus further improving the heat resistance reliability of the circuit device.

In the above structure, the circuit device preferably further comprises a wiring layer, provided on the other surface of the metal substrate, which electrically connects each of the sectioned regions. By employing this structure, the demarcated regions can be easily electrically-connected with each other while maintaining the condition of direct heat conduction to the metal substrate. This increases design freedom concerning the demarcation of metal substrate into sections. As a result, it is possible to achieve area saving of the circuit device while improving the heat release performance thereof.

In the above-described structure, it is preferable that the circuit device further comprise a third circuit element whose heat generation rate is less than that of at least one of the first circuit element and the second element and that the third element be mounted on a surface, in both faces of the wiring layer, opposite to the surface on which the metal substrate is provided. In this case, the first circuit element and the second circuit element, which produce relatively much heat, are mounted on one face of a highly heat-radiant metal substrate, and the third circuit elements whose heat generation rate is less than that of at least one of the first circuit element and the second element are mounted on one face of the wiring layer. That is, according to this embodiment, a plurality of circuit elements having different heat generation rates are mounted, as appropriate, on the metal substrate or the wiring layer, thus realizing smaller size by reducing packaging area without impairing the radiation performance.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 6A to 6D are cross-sectional views for explaining a manufacturing process for a circuit device according to a first embodiment of the present invention;

FIGS. 7A to 7D are cross-sectional views for explaining a manufacturing process for a circuit device according to a first embodiment of the present invention;

FIG. 14 is a diagram schematically illustrating a temperature change of a system where the drive of a circuit element is temporarily turned on.

DETAILED DESCRIPTION OF THE INVENTION

Figure 1:
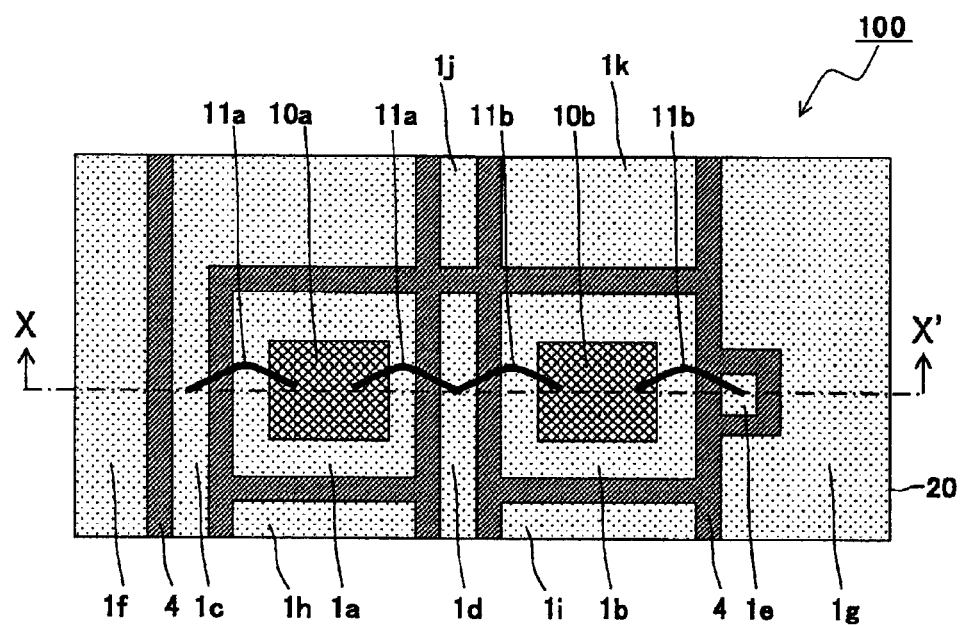
FIG. 1 is a plan view showing how a metal substrate constituting a circuit device according to a first embodiment of the present invention is demarcated into sections.

The invention will now be described by reference to the preferred embodiments. This does not intend to limit the scope of the present invention, but to exemplify the invention.

Note that the identical components are given the identical reference numerals in all accompanying Figures and the repeated description thereof will be omitted as appropriate.

First Embodiment

A description will now be given of a circuit device according a first embodiment, with reference to FIG. 1 and FIG. 2.

FIG. 1 is a plan view showing how a metal substrate constituting a circuit device 100 according to the first embodiment is demarcated into sections. A metal substrate 20 of this circuit device, which is made of a copper (Cu) plate with high thermal conductivity, is demarcated such that an insulating film 4 to be described later surround copper plates 1a and 1b, which are the regions for mounting circuit elements 10a and 10b, and copper plates 1c, 1d and 1e, which are regions for connecting bonding wires 11a and 11b (regions used as wire connecting electrodes within the metal substrate).

Figure 2:
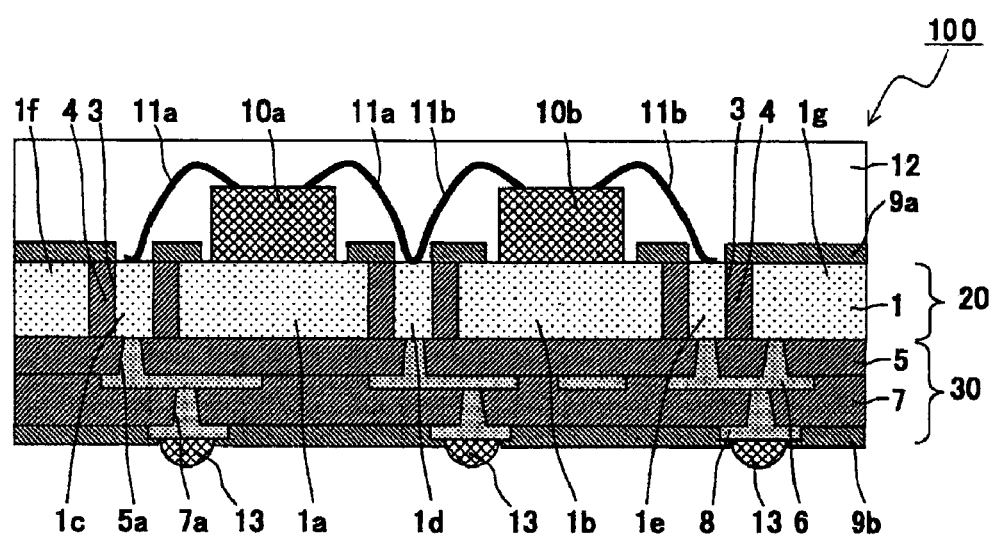
FIG. 2 is a schematic cross-sectional view of a circuit device taken along the line X-X' of FIG. 1.

FIG. 2 is a schematic cross-sectional view of a circuit device 100 taken along the line X-X' of FIG. 1. This circuit device 100 includes a metal substrate 20, two circuit elements 10a and 10b, bonding wires 11a and 11b, a sealing resin layer 12, and a wiring layer 30.

As shown in FIG. 1, the metal substrate 20 is formed of an insulating film 4 and copper plates 1a to 1k (copper plates 1a to 1g in FIG. 2), which are sections surrounded by the insulating film 4. The demarcation of the copper plate is done, for instance, for each circuit element mounted on the metal substrate 20 or, more preferably, for each circuit element which has a different voltage applied to the portion thereof connected to the metal substrate 20. In FIG. 2, a circuit element 10a, which has a predetermined voltage applied to the portion thereof connected to the metal substrate 20, and a circuit element 10b, which has a voltage different from that of the circuit element 10a applied to the portion thereof connected to the metal substrate 20, are mounted on the copper plates 1a and 1b, which are the regions demarcated for them respectively. Also, the copper plates 1a and 1b, on which the circuit elements 10a and 10b are mounted, are provided with larger areas than those of the circuit elements 10a and 10b respectively, and the copper plates 1a and 1b have their outer edges in positions outside the outer edges of the circuit elements 10a and 10b, respectively. It is to be noted that according to the present embodiment, the copper plate is also demarcated for the regions where bonding wires are connected.

Figure 3:
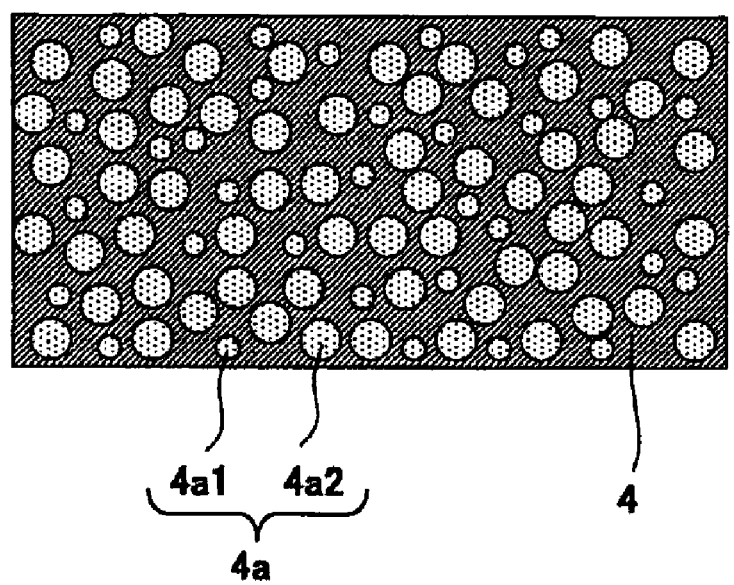
FIG. 3 schematically illustrates a distribution of fillers filled in a insulating film of a circuit device according to a first embodiment of the present invention.
Figure 4:
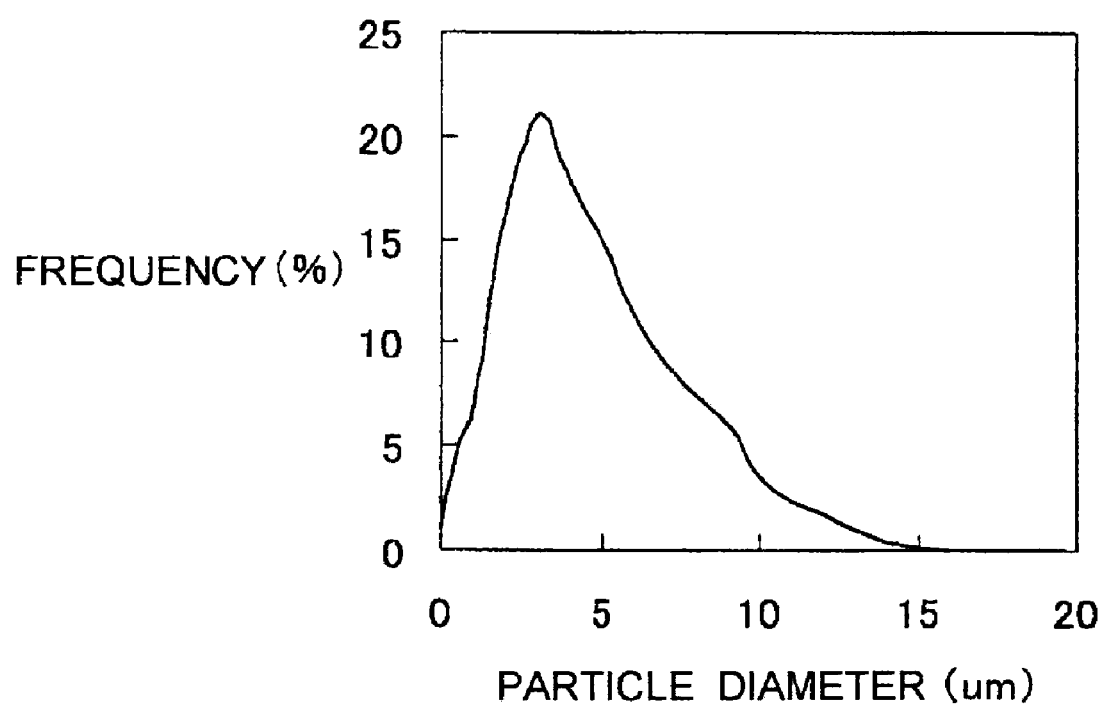
FIG. 4 is a graph showing a distribution of fillers filled in a insulating film of a circuit device according to a first embodiment of the present invention.

Here, the insulating film 4 is formed in such a manner that it is embedded in a groove 3 which penetrates the copper plate (metal substrate). As shown in FIG. 3, the insulating film 4 is an epoxy resin film with a filler 4a added to raise the thermal conductivity (a resin film with a heat-conduction-promoting filler 4a added). To be more precise, the insulating film 4 is made of an epoxy resin filled, at a weight filling factor of about 75 percent, with a filler 4a, which contains at least filler 4a1 and filler 4a2 having their respective particle sizes corresponding to two mutually different kinds of average particle size. The average particle diameters of the filler 4a1 and filler 4a2 are about 0.7 µm and about 3 µm, respectively. Also, the filler 4a1 (average particle size: about 0.7 µm) and the filler 4a2 (average particle size: about 3 µm) are added at frequencies of occurrence as shown in FIG. 4. More specifically, the compounding ratio of the filler 4a1 and filler 4a2 are 2:8. In this manner, by mixing fillers having two mutually different kinds of average particle size, the filler 4a1 having smaller particle sizes enter the gaps made between the filler 4a2 having larger particle sizes, so that the insulating film 4 can be filled more densely with the filler 4a. This effectively raises the thermal conductivity of the insulating film 4. Also, the material used for the fillers 4a1 and 4a2 is alumina ($Al_2O_3$), which can improve the thermal conductivity of the insulating film 4. The thermal conductivity of the insulating film 4 will be about 4.4 W/(m·K) with the fillers 4a1 and 4a2 added as described above. Note that the thermal conductivity of epoxy resin without the addition of filler is about 0.6 W/(m·K).

Also, as shown in FIG. 2, formed on top of the metal substrate 20 is a solder resist layer 9a which covers the insulating film 4 and the copper plates 1a to 1g and has openings corresponding to part of the copper plates 1a and 1b, where circuit elements are mounted, and part of the copper plates 1c, 1d and 1e, which are the regions for wire bonding connection. This solder resist layer 9a functions as a protective film for the metal substrate 20.

The circuit elements 10a and 10b are the circuit elements with mutually different voltages applied to their respective portions connected to the metal substrate 20. For example, if the two circuit elements perform switching operation, they have mutually different voltages between when the voltage is applied (on state) and when the voltage is not applied (off state). The circuit elements 10a and 10b are mounted on the demarcated metal substrate 20 via their respective bonding layers (not shown) of conductive material. As a result, the demarcated metal substrate 20 (copper plates 1a and 1b) are electrically connected to their respective circuit elements 10a and 10b, and the metal substrate 20 is maintained at the voltages applied to the respective circuit elements.

The bonding wires 11a and 11b are, for instance, aluminum or gold wires, which electrically connect the circuit elements 10a and 10b mounted on the metal substrate 20 to their predetermined regions (regions corresponding to the conventional pad electrode portions) of the metal substrate 20.

The sealing resin layer 12 seals the circuit elements 10a and 10b mounted on the metal substrate 20, thereby protecting the circuit elements 10a and 10b against external influences. The material for the sealing resin layer 12 is, for instance, a thermosetting insulating resin, such as epoxy resin. It should be noted that the sealing resin layer 12 may have a filler added thereto to raise its thermal conductivity.

The wiring layer 30, which is formed on the opposite side of the metal substrate 20 (the face opposite to the one on which the circuit elements 10a and 10b are mounted), has a structure resulting from alternately laminating insulating films 5 and 7 and conductive films (wiring patterns) 6 and 8. This wiring layer 30 ensures electrical connection between the demarcated sections of metal substrate 20 and electrical connection with external connection terminals (solder balls) 13.

Also, as shown in FIG. 2, formed on the bottom of the wiring layer 30 is a solder resist layer 9b which covers the insulating film 7 and the wiring pattern 8 and has openings in positions corresponding to the regions for forming the external connection terminals 13. This solder resist layer 9b functions as a protective film for the wiring layer 30.

FIGS. 5 through 9 are cross-sectional views for explaining a manufacturing process for a circuit device according to the first embodiment of the present invention as shown in FIG. 2. Note that FIGS. 5 through 9 are cross-sectional views of a circuit device taken along the line X-X' of FIG. 1 as is the case with FIG. 2. Hereinbelow, the manufacturing process for a circuit device according to the present embodiment will be described by referring to FIG. 2 and FIGS. 5A-5D through FIGS. 9A-9B.

Figure 5A:
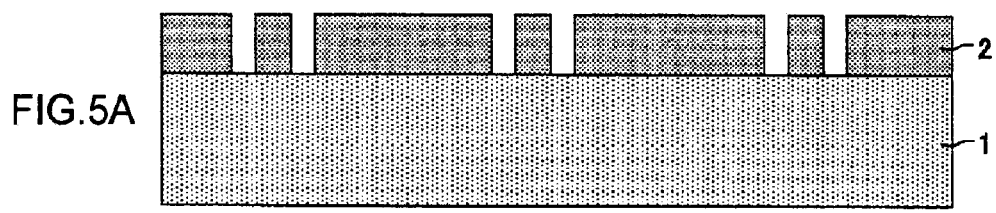
FIGS. 5A to 5D are cross-sectional views for explaining a manufacturing process for a circuit device according to a first embodiment of the present invention.

Firstly, as illustrated in FIG. 5A, a resist pattern 2 with the resist removed in the regions where grooves 3 to be described later will be formed is selectively formed by lithography on a copper plate 1 (copper plates 1a to 1g in a subsequent process).

Figure 5B:
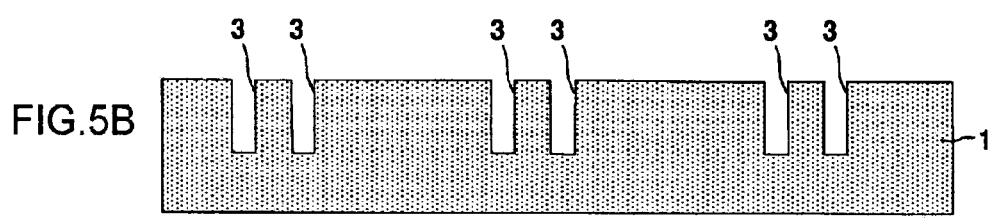

As illustrated in FIG. 5B, an exposed portion of the copper plate 1 is half-etched and grooves (recesses) 3 are formed by a wet-etching technique before the resist patter 2 is peeled off.

Figure 5C:
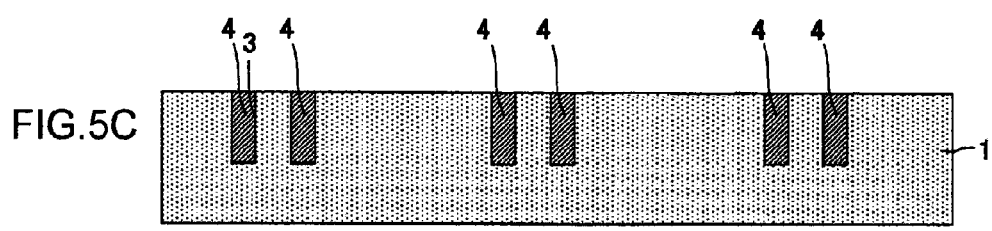

As illustrated in FIG. 5C, a resin containing a filler 4a at a predetermined ratio is applied, and then insulating film 4 is formed by filling the grooves (recesses) 3 with the resin by scraping with a squeegee or like means.

Figure 5D:
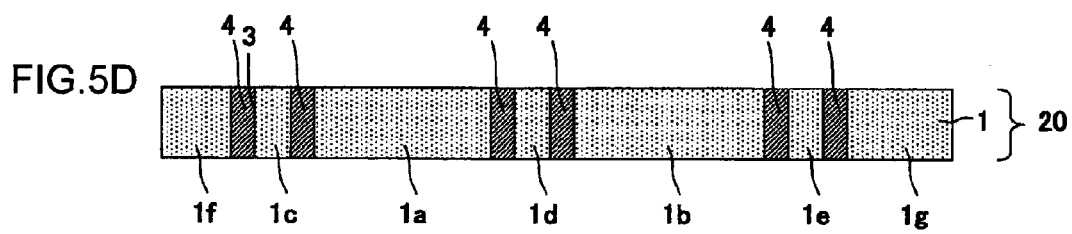

As illustrated in FIG. 5D, the back side of the copper plate 1 (the face opposite to the one on which the circuit elements are mounted as described later) is ground off, so that the insulating film 4 filled in the grooves (recesses) 3 are exposed on the back side of the copper plate 1. This results in the formation of a metal substrate 20 comprised of the insulating film 4 and the copper plates 1a to 1g demarcated by the insulating film 4.

Next, as illustrated in FIG. 6A, an epoxy resin is applied to the back side of the metal substrate 20 (copper plate 1) to form an insulating film 5. Note that this insulating film 5 may have a filler added therein to raise the thermal conductivity. After this, a copper foil 6z is press-bonded to the surface of the insulating film 5. It should be noted here that the insulating film 5 and the copper foil 6z may be formed by preparing a laminated body of insulating film 5 and copper foil 6z in advance and then thermally press-bonding the laminated body to the back side of the metal substrate 20 (copper plate 1).

As illustrated in FIG. 6B, the copper foil 6z in positions corresponding to the regions where via holes 5a (see FIG. 2) are formed is removed by using photolithography and etching techniques. This exposes the regions in the insulating film 5 where via holes 5a are formed.

As illustrated in FIG. 6C, the regions from the exposed surfaces of the insulating film 5 to the surface of the metal substrate 20 (copper plate 1) are removed by the irradiation thereto of carbon dioxide laser or UV laser from above the copper foil 6z (the back side of the metal substrate 20). This results in the formation of via holes 5a penetrating the insulation film 5.

As illustrated in FIG. 6D, copper is plated on the surface of the copper foil 6z and the inner surface of the via holes 5a by electroless plating. Then the surface of the copper foil 6z and the inside of the via holes 5a are plated by electrolytic plating. Note that in the present embodiment, an inhibitor and an accelerator are added in the plating liquid, so that the inhibitor is adsorbed on the surface of the copper foil 6z and the accelerator is adsorbed on the inner surface of the via holes 5a. Since this makes the copper plating on the inner surface of the via holes 5a thicker, it is now possible to embed copper in the via holes 5a. As a result, as illustrated in FIG. 6D, a conductive film 6 is not only formed on the insulating film 5 but also embedded in the via holes 5a. At this time, it is to be noted that a conductive film 6a (conductive film 6a on the side faces not shown) is also formed on the top surface (the surface on which the circuit elements are mounted as described later) of the metal substrate 20 and on the side faces of the metal substrate 20.

Next, as illustrated in FIG. 7A, patterning of the conductive film 6 is carried out by using photolithography and etching techniques. This results in the formation of a conductive film 6 which has a predetermined wiring pattern.

As illustrated in FIG. 7B, an epoxy resin made of the same material as the previously-described insulating film 5 in such a manner as to cover the conductive film (wiring pattern) 6, thus forming an insulating film 7. Thereafter, a copper foil 8z is press-bonded to the surface of the insulating film 7. It is to be noted here that the insulating film 7 and the copper foil 8z may be formed by preparing a laminated body of insulating film 7 and copper foil 8z in advance and then thermally press-bonding the laminated body to the back side of the metal substrate 20 (copper plate 1).

As illustrated in FIG. 7C, the copper foil 8z in positions corresponding to the regions where via holes 7a (see FIG. 2) are formed is removed by using photolithography and etching techniques. This exposes the regions in the insulating film 7 where via holes 7a are formed.

As illustrated in FIG. 7D, the regions from the exposed surfaces of the insulating film 7 to the surface of the conductive film 6 are removed by the irradiation thereto of carbon dioxide laser or UV laser from above the copper foil 8z (the back side of the metal substrate 20). This results in the formation of via holes 7a penetrating the insulation film 7.

Figure 8A:
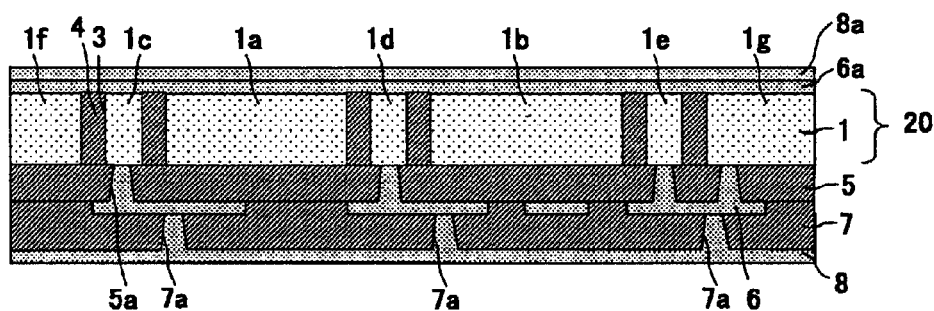
FIGS. 8A to 8C are cross-sectional views for explaining a manufacturing process for a circuit device according to a first embodiment of the present invention.

Next, as illustrated in FIG. 8A, copper is plated on the surface of the copper foil 8z and the inner surface of the via holes 7a by electroless plating. Then the surface of the copper foil 8z and the inside of the via holes 7a are plated by electrolytic plating. At this time, an inhibitor and an accelerator are added in the plating liquid, so that the inhibitor is adsorbed on the surface of the copper foil 8z and the accelerator is adsorbed on the inner surface of the via holes 7a. Since this makes the copper plating on the inner surface of the via holes 7a thicker, it is now possible to embed copper in the via holes 7a. As a result, a conductive film 8 is not only formed on the insulating film 7 but also embedded in the via holes 7a. At this time, it is to be noted that a conductive film 8a (conductive film 8a on the side faces not shown) is also formed on the top surface side (the surface on which the circuit elements are mounted as described later) of the metal substrate 20 and on the surface of conductive film 6a at the side faces of the metal substrate 20.

Figure 8B:
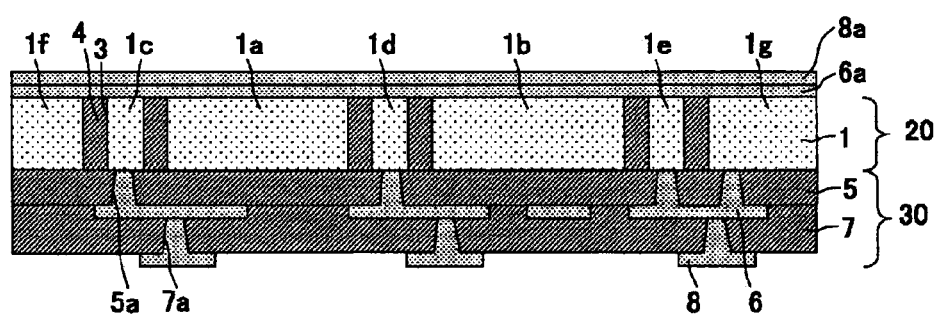

As illustrated in FIG. 8B, patterning of the conductive film 8 is carried out by using photolithography and etching techniques. This results in the formation of a conductive film 8 which has a predetermined wiring pattern. As a result, a wiring layer 30 having a structure of the insulating films 5 and 7 and the conductive films (wiring pattern) 6 and 8 laminated alternately is formed on the back side of the metal substrate 20.

Figure 8C:
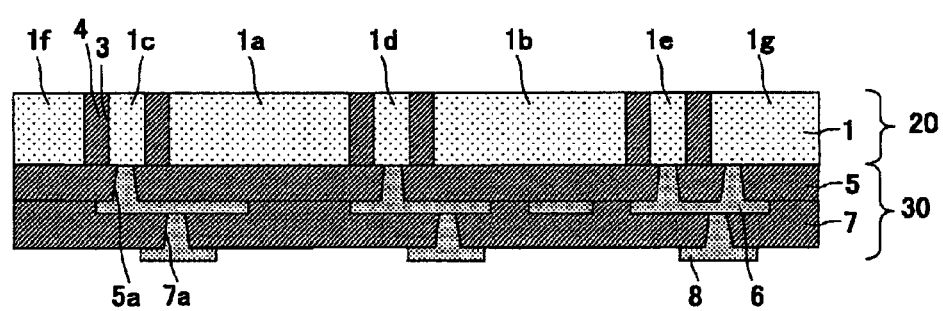

As illustrated in FIG. 8C, after the formation of a protective film (not shown) on the back side of the metal substrate 20, the conductive film 6a and the conductive film 8a provided on the top surface and the side surfaces of the metal substrate 20 are removed by etching. And after this etching, the protective film is removed.

Figure 9A:
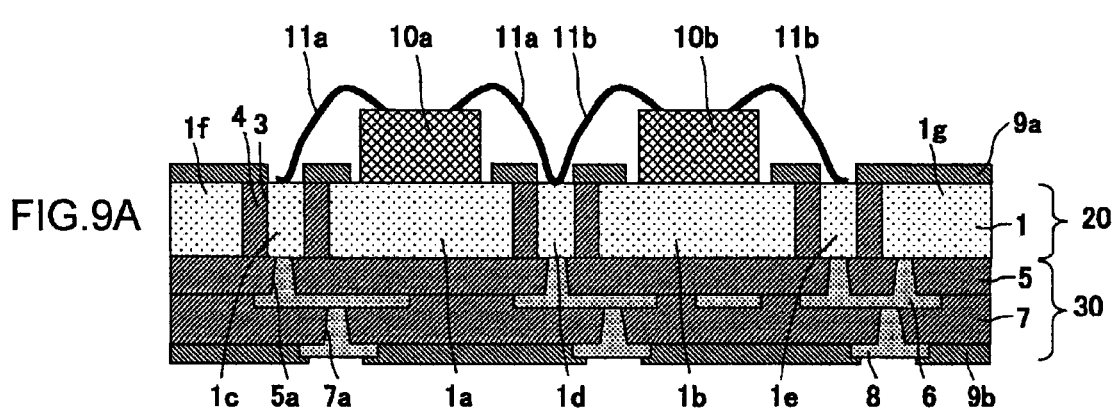
FIGS. 9A and 9B are cross-sectional views for explaining a manufacturing process for a circuit device according to a first embodiment of the present invention.

Next, as shown in FIG. 9A, a solder resist layer 9a is formed which covers the metal substrate 20 (the insulating film 4 and the copper plates 1a to 1g) and has openings corresponding to part of the copper plates 1a and 1b of the metal substrate 20, where circuit elements are mounted, and part of the copper plates 1c, 1d and 1e thereof, which are the regions for wire bonding connection. Further, a solder resist layer 9b is formed which covers the insulating film 7 and the wiring pattern 8 and has openings in positions corresponding to the regions for forming the external connection terminals 13. Note here that the formation of the solder resist layers 9a and 9b may be carried out by first thermally press-bonding a solder resist film without openings on both sides at the same time and then forming openings in positions corresponding to the above-mentioned regions. Then the circuit elements 10a and 10b are mounted on top of the copper plates 1a and 1b, respectively, through the medium of a bonding layer (not shown) made of a conductive material. In this manner, the copper plates 1a and 1b are electrically connected to the circuit elements 10a and 10b, respectively, and thus mutually different voltages are applied to the respective portions of the circuit elements connected to the metal substrate 20. Then the circuit elements 10a and 10b are electrically connected to the copper plates 1c, 1d and 1e, which are the wire bonding regions of the metal substrate 20 (regions corresponding to the conventional pad electrode portions) by means of bonding wires 11a and 11b, which are, for instance, aluminum or gold wires.

Figure 9B:
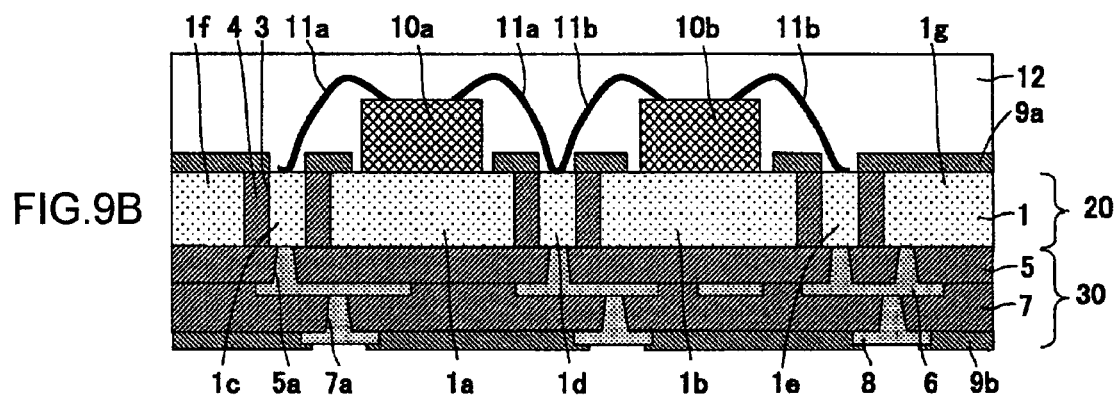
Figure 10:
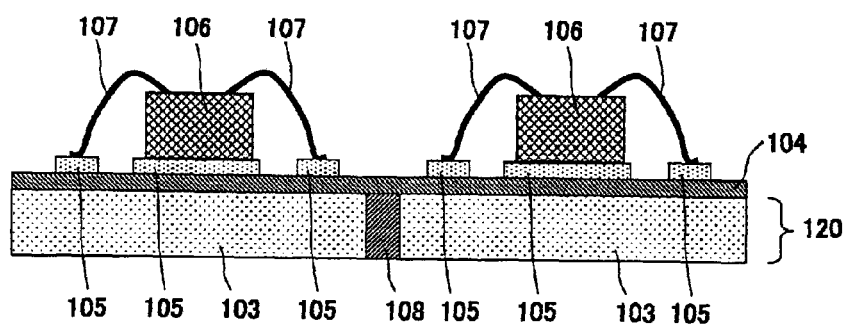
FIG. 10 is a cross-sectional view schematically illustrating a structure of a conventional circuit device.

As illustrated in FIG. 9B, a sealing resin layer 12, made of an epoxy resin, is formed in such a manner as to cover the circuit elements 10a and 10b on the metal substrate 20 to protect them.

Finally, as shown in FIG. 2, solder balls 13, which will function as external connection terminals, are formed on the surface of the conductive film 8 (parts exposed in the openings in the solder resist layer 9b) by a solder printing method. To be more specific, a "solder paste", which is resin and solder in a pasty state, is printed in desired positions through a screen mask, and then the solder balls 13 are formed by heating the paste to the melting point of the solder.

A circuit device according to the present embodiment can be manufactured by the process as described above.

According to the present embodiment, an operation is performed and advantageous effects thereby are achieved as follows.

(1) The circuit elements 10a and 10b, which have mutually different voltages applied to the respective portions thereof connected to the metal substrate 20, can be disposed in an electrically-connected state on the metal substrate 20 (copper plates 1a and 1b), so that the heat generated by the circuit elements 10a and 10b may be directly conducted to the respective sections of the metal substrate 20 (copper plates 1a and 1b). This increases the heat release performance, thus improving the heat resistance reliability of the circuit device.

(2) The insulating film 4, which exists between the demarcated sections of the metal substrate 20, absorbs the expansion of the metal substrate 20 (copper plates 1a and 1b) caused by the heat conducted from the circuit elements 10a and 10b. This reduces warping of the circuit device, thereby reducing the drop of reliability of the circuit device due to the heat release from the circuit elements.

(3) The copper plates 1a and 1b, on which the circuit elements 10a and 10b are mounted, have their outer edges in positions beyond the peripheries of the respective circuit elements, so that the heat generated by the circuit elements are conducted uniformly into the copper plates 1a and 1b within the respective planes of the circuit elements 10a and 10b. This results in effective heat release from the circuit elements 10a and 10b.

(4) The bonding wires 11a and 11b are directly connected from the circuit elements 10a and 10b to the copper plates 1c, 1d and 1e, which are the regions used as wire connection electrodes (regions corresponding to the conventional pad electrode portions) within the metal substrate 20, so that the heat generated in these connection portions are conducted directly to the metal substrate 20 (copper plates 1c, 1d and 1e). This increases the heat release performance, thus further improving the heat resistance reliability of the circuit device.

(5) The insulating film 4 has a heat-conduction-promoting filler added thereto, so that part of the heat conducted from the circuit element 10a to the copper plate 1a directly below, for instance, is further conducted to the copper plates 1c, 1d, 1h and 1j through the insulating film 4 adjacent to the copper plate 1a. This increases the heat release performance of the copper plate 1a, on which the circuit element 10a is mounted, thus further improving the heat resistance reliability of the circuit device.

(6) The demarcated copper plates can be easily electrically-connected with each other by the wiring layer 30 while maintaining the condition of direct heat conduction to the metal substrate 20. This increases design freedom concerning the demarcation of metal substrate into sections. As a result, it is possible to achieve area saving of the circuit device while improving the heat release performance thereof.

Second Embodiment

In a circuit device according to a second embodiment of the present invention, circuit elements are not only mounted on the metal substrate as with the circuit device 100 described in the first embodiment, but they are also mounted on a wiring layer on the opposite side of the metal substrate. This structure allows effective arrangement of a plurality of circuit elements which have varied functions. Hereinbelow, a description will be given of a circuit device capable of driving a small fan motor as an example of such a circuit device.

Figure 11:
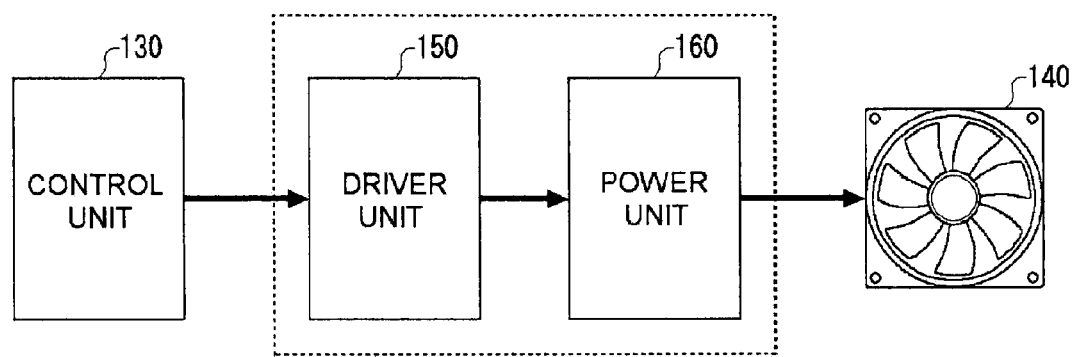
FIG. 11 is a functional block diagram of a system for driving a fan motor.

FIG. 11 is a functional block diagram of a system for driving a fan motor. A control unit 130 generates a control signal to run a fan motor 140 based on a signal from a operation unit, such as a temperature sensor or a button, and outputs it to a driver unit 150. A driver unit 150 amplifies the control signal to such an extent as can drive a power unit 160. The power unit 160 directly drives the fan motor 140 based on the amplified control signal.

The control unit 130 is preferably of a structure capable of advanced control from the viewpoint of noise reduction and low power consumption. To be more specific, the control unit 130 includes parts manufactured by fine CMOS processes, including a signal processor, RAM, flash memory, and the like. Also, the power supply voltage for the control unit 130 is as low as approximately 1.5 to 3 V.

The driver unit 150, which is designed according to the structure of a power device equipped in the power unit 160, needs to have a function for amplifying the voltage or current to a certain extent. For example, a discrete device, such as a bipolar transistor, is well-suited for the driver unit 150.

The power unit 160 is required to have a drive capability sufficient to drive a load, such as the fan motor 140, efficiently. For example, a discrete device, such as a MOS transistor, a bipolar transistor, or an insulated gate bipolar transistor, is well-suited for the power unit.

To package a system as shown in FIG. 11, it is necessary to use packaging technology such as follows:

(i) High-Radiation Packaging Technology

A power device equipped in the power unit 160 tends to generate more heat due to Joule heat when the equipment load to be driven is large. Hence, it is necessary to use packaging technology suited to high-radiation substrates.

(ii) High-Density Packaging Technology

A packaging technology applicable to multilayer fine-wiring boards is required to package at high density a control unit 130 which is comprised of parts manufactured by fine CMOS processes.

Therefore, in a circuit device according to the present embodiment, devices constituting a driver unit 150 and a power unit 160, which produce relatively much heat, are mounted on one face of a metal substrate 20, which is highly heat-radiant, and devices constituting a control unit 130, which produces relatively little heat, is mounted on one face of a wiring layer 30, which is of a multilayer wiring structure.

Figure 12:
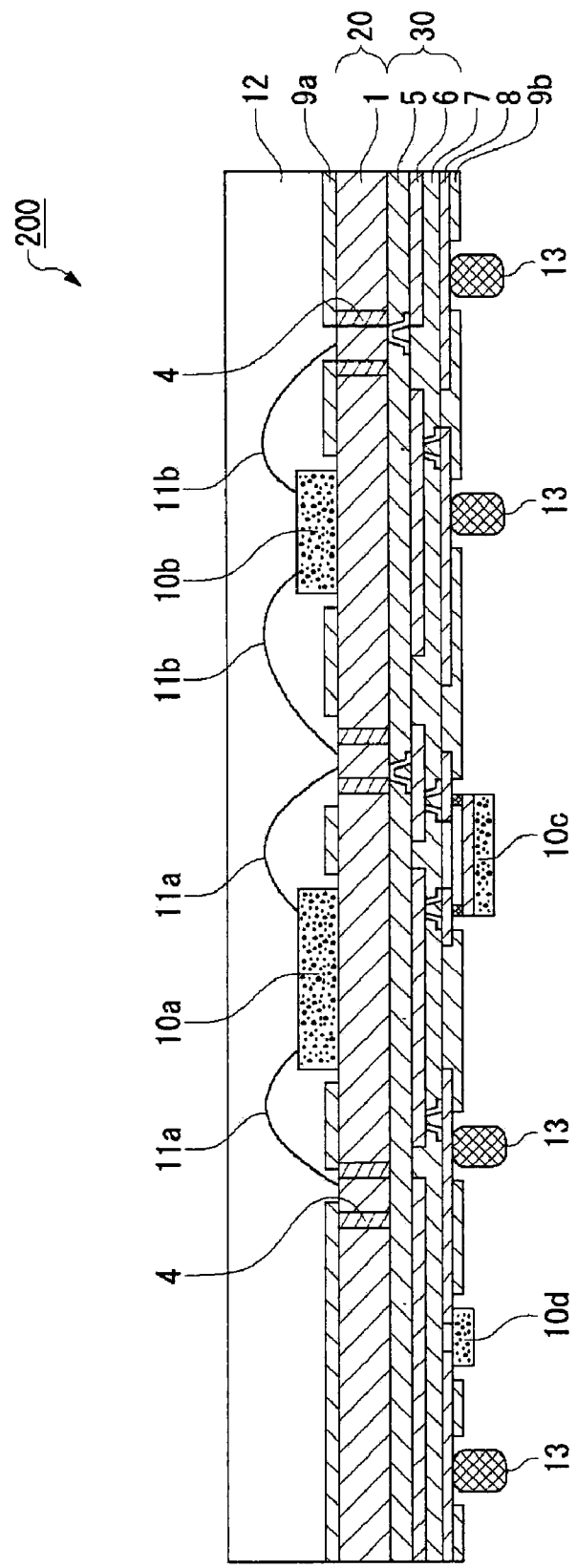
FIG. 12 is a schematic cross-sectional view of a circuit device according to the second embodiment of the present invention.

FIG. 12 is a schematic cross-sectional view of a circuit device according to the second embodiment of the present invention. The circuit device 200 is markedly different from the circuit device 100 in that the circuit elements are mounted on one face of a wiring layer 30 thereof. In the following description, the same content as explained in the first embodiment will be omitted as appropriate.

The circuit device 200 is manufactured by mounting circuit elements 10c and 10d on a conductive film 8 of the wiring layer 30 through a bonding layer (not shown) made of solder and conductive material when solder balls 13 are formed by a method as shown in FIG. 2 after the same process illustrated in FIGS. 5A-5D through FIGS. 9A-9B as the first embodiment. Here, the circuit elements 10a and 10b function as the aforementioned driver unit 150 and power unit 160, which produce relatively much heat. And the circuit elements 10c and 10d function as the aforementioned control unit 130 or passive elements, which produce relatively little heat. In other words, the circuit elements 10c and 10d produce less heat than the circuit elements 10a and 10b.

In this manner, the circuit device 200 can be so configured that the circuit elements 10a and 10b, functioning as a driver unit 150 and a power unit 160, which produce relatively much heat, are mounted on one face of a highly heat-radiant metal substrate, and the circuit elements 10c and 10d, functioning as a control unit 130, which produces relatively little heat, are mounted on one face of a high-density-packaging type wiring layer 30, which is opposite to the side on which the metal substrate is disposed. Therefore, the circuit device 200, which allows a single packaging of a system as shown in FIG. 11, realizes smaller size by reducing packaging area and reduction of manufacturing cost by reducing the number of components used.

Also, in the circuit device 200, the driver unit 150, the power unit 160, and the control unit 130 are connected with one another within a single package by the conductive films 6 and 8 of the wiring layer 30 and the copper embedded in the via holes 5a and 7a. Thus, the circuit device 200 can reduce the number of connection pins required compared with the case where the driver unit 150, the power unit 160, and the control unit 130 are set in separate packages. Also, the circuit device 200 can shorten the delay in signal transfer compared with the case where the driver unit 150, the power unit 160, and the control unit 130 are connected together by wire.

Volume of Metal Substrate

Figure 13:
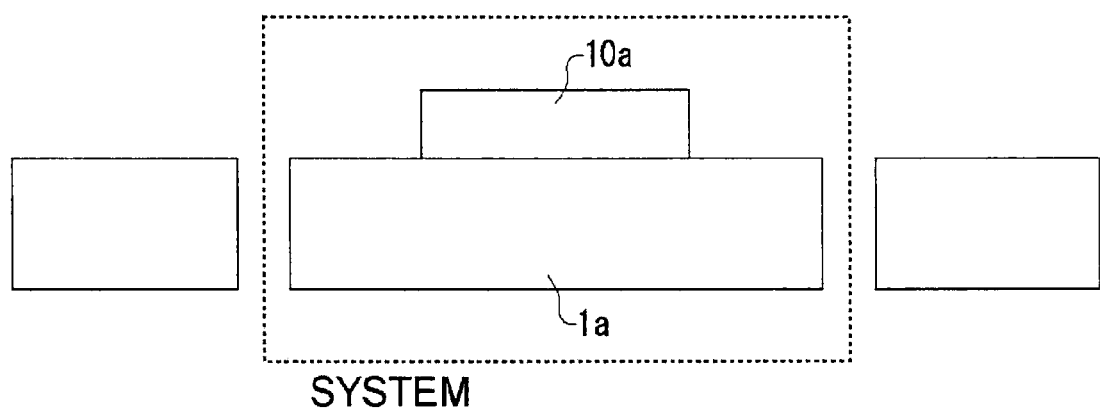
FIG. 13 is a schematic diagram for explaining a system formed by a circuit element and a part of a metal substrate on which a circuit element is mounted.

In the circuit device according to the preferred embodiments so far described, the regions where circuit elements are mounted are demarcated by an insulating film. Hence, it can be assumed that a circuit element and a part of the metal substrate to which the circuit element is jointed forms a closed system. FIG. 13 is a schematic diagram for explaining a system formed by a circuit element and a part of the metal substrate on which the circuit element is mounted.

As illustrated in FIG. 13, a circuit element 10a is mounted on a copper plate 1a of a multiplicity of copper plates constituting the metal substrate 20. Accordingly, the heat generated by the circuit element 10a, as it is driven, is preferentially dissipated in the copper plate 1a and released therethrough. However, if there is more heat generated by the circuit element 10a than the heat released from the copper plate 1a, then the temperature of the system as a whole will rise gradually. And this may sometimes result in a fault of the circuit element 10a or a separation of the circuit element 10a from the copper plate 1a.

Figure 14:
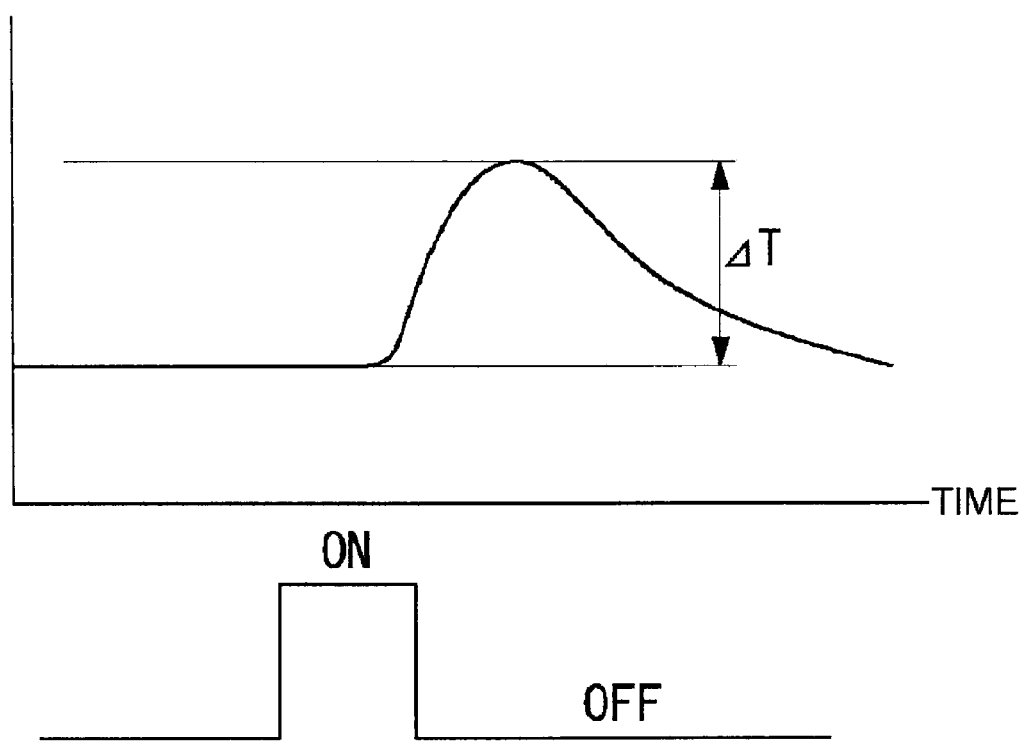

FIG. 14 is a diagram schematically illustrating a temperature change of a system where the drive of a circuit element is temporarily turned on. As shown in FIG. 14, the temperature of the system rises gradually with the drive of the circuit element turned on and drops gradually from the point a little while after the drive of the circuit element is turned off. If the temperature variation at this time is $\Delta T$, then the larger the temperature variation $\Delta T$, the greater the probability will be for the above-mentioned fault or separation of the circuit element.

Thus, use of a larger volume V of the copper plate 1a is conceivable as a measure for making the temperature variation $\Delta T$ smaller while the circuit element 10a is energized. Where circuit elements with the same rate of heat generation are mounted, the larger volume V of each copper plate raises the thermal capacity, thus favorably making the temperature variation $\Delta T$ of the whole system smaller. Nevertheless, too large a volume V thereof may lead to a larger size of the circuit device. Therefore, an upper limit of the volume V of each copper plate may be selected as appropriate according to the size of the equipment into which the circuit device is incorporated or the amount of heat generated by the circuit element.

On the other hand, a lower bound of the volume V of each copper plate may be determined by the following Equation (1):

$$V > \frac{Q}{\rho \cdot C \cdot \Delta Tth} \quad (1)$$

In Equation (1), $V[m^3]$ is the volume of metal substrate in the section where a circuit element is mounted; $Q[J]$ is the amount of heat generated by power loss during the energization of a circuit element; $\rho[kg/m^3]$ is the density of metal substrate; $C[J/kg \cdot K]$ is the specific heat of metal substrate; and $\Delta Tth[K]$ is the upper limit of temperature variation where no fault of the system results from the heat generation of a circuit element.

That is, a lower limit of the volume V of the metal substrate in the section where the circuit element is mounted is obtained from the amount of heat generation Q of the circuit element while energized, the upper limit $\Delta Tth$ of temperature variation as determined from the difference between the ambient temperature and the upper bound of operating temperature where the circuit element functions normally, and the density $\rho$ and specific heat C of the material of the metal substrate. The upper limit value $\Delta Tth$ of temperature variation can be obtained as 125 [K], for instance, if the upper bound of operating temperature of Si is 150° C. and the ambient temperature of the circuit element is 25° C.

Figure 15:
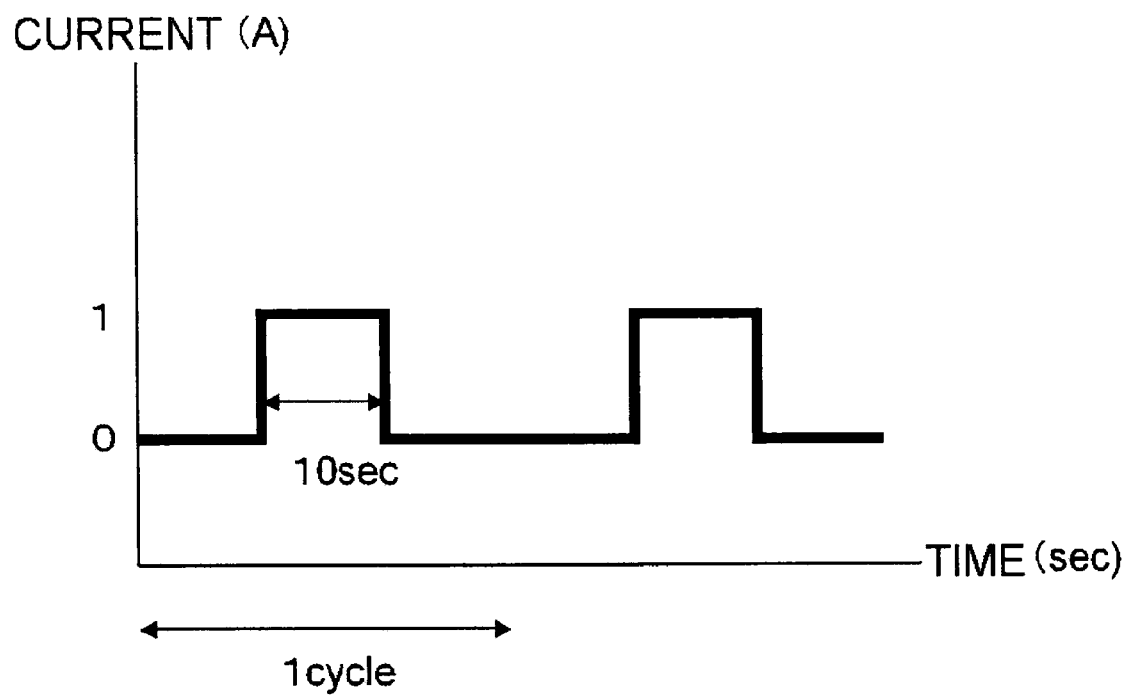
FIG. 15 is a schematic representation of a pulse current that flows through a circuit element according to a second embodiment of the present invention.

Hereinbelow is an example of calculation of a lower bound of the volume V of a copper plate. FIG. 15 is a schematic representation of a pulse current that flows through a circuit element according to the second embodiment. In the example of FIG. 15, a current I of 1 [A] is carried to the circuit element for 10 [sec] per cycle.

If the ON resistance of a circuit element is Ron=1[Ω] and the energizing time per cycle is t=10[sec], the power loss at the circuit element per cycle will be $Q=I^2 \times Ron \times t=10[J]$. In the case of a copper plate where a circuit element energized by a pulse current as shown in FIG. 15 is mounted, if the density of copper is $\rho=8880[kg/m^3]$, the specific heat of copper is $C=0.386[J/kg \cdot K]$, and the upper limit of temperature variation is $\Delta Tth=125[K]$, then the volume V can be calculated by Equation (1) as follows.

$$V=10/(8880 \times 0.386 \times 125)=2.334 \times 10^{-5}[m^3]$$

Hence, we know that the aforementioned circuit element should be mounted on a copper plate whose volume is larger than this value.

Thus, the operation reliability of a circuit device may be improved by designing it such that the volume of the metal substrate in the section where each circuit element is mounted satisfies Equation (1).

In the above-described embodiments, an example has been presented where two circuit elements with different potentials are mounted within a circuit device. However, the present invention is not limited thereto, and it is also applicable to a circuit device in which three or more circuit elements are mounted. Also, when a plurality of circuit elements with the same voltage applied to the portions connected to the metal substrate are involved, those circuit elements may be mounted on the demarcated and separate metal substrates (copper plates). This may further increase the design freedom concerning the sections of metal substrate. As a result, the area of the circuit device may be reduced while improving the heat radiation performance of the circuit device. The further subdivision of the metal substrate (copper plates) reduces the expansion of the metal substrate (copper plates) due to the heat conducted from the circuit element, thereby reducing the warping of the circuit device.

Also, in the above-described embodiments, the metal substrate has a uniform thickness but the present invention is not limited thereto. For example, for higher (thicker) circuit elements to be mounted, the metal substrate (copper plates) in the regions where such circuit elements are mounted may be made thinner. In this manner, the height of the circuit device may be made thinner effectively compared with the circuit device having the metal substrate of uniform thickness.

While the preferred embodiments of the present invention have been described using specific terms, such description is for illustrative purposes only, and it is to be understood that changes and variations may be made without departing from the spirit or scope of the appended claims.

What is claimed is:

1. A circuit device, comprising:
 a metal substrate which is sectioned into a plurality of regions by an insulating film; and
 a first circuit element and a second circuit element which are electrically connected with said metal substrate, wherein said first circuit element and said second circuit element are mounted, respectively, directly on different ones of the plurality of regions of said metal substrate on a same side of the metal substrate, and wherein the respective regions on which the first and second circuit elements are mounted are separated from one another by the insulating film, and wherein the first circuit element is placed such that the first circuit element's edges, in their entirety, are located within a single region defined by the insulating film when viewed in a direction perpendicular to the insulating film and the second circuit element is placed such that the second circuit element's edges, in their entirety, are located within a single region defined by the insulating film when viewed in a direction perpendicular to the insulating film, wherein a first voltage is applied to a connection part of said first circuit element connected with said metal substrate, and a second voltage differing from the first voltage is applied to a connection part of said second circuit element connected with said metal substrate.

2. A circuit device according to claim 1, wherein the plurality of regions include a region that functions as an electrode used for wire connection.

3. A circuit device according to claim 1, wherein the plurality of regions include a region that functions as an electrode used for wire connection.

4. A circuit device according to claim 1, wherein the plurality of regions include a region that functions as an electrode used for wire connection.

5. A circuit device according to claim 1, wherein the insulating film is made of resin film added with a filler used to enhance heat transfer.

6. A circuit device according to claim 1, further comprising a wiring layer, provided on the other surface of said metal substrate, which electrically connects each of the sectioned regions.

7. A circuit device according to claim 1, further comprising a wiring layer, provided on the other surface of said metal substrate, which electrically connects each of the sectioned regions.

8. A circuit device according to claim 1, further comprising a wiring layer, provided on the other surface of said metal substrate, which electrically connects each of the sectioned regions.

9. A circuit device according to claim 2, further comprising a wiring layer, provided on the other surface of said metal substrate, which electrically connects each of the sectioned regions.

10. A circuit device according to claim 5, further comprising a wiring layer, provided on the other surface of said metal substrate, which electrically connects each of the sectioned regions.

11. A circuit device according to claim 6, further comprising a third circuit element whose heat generation rate is less than that of at least one of said first circuit element and said second element, wherein said third element is mounted on a surface, in both faces of said wiring layer, opposite to the surface on which said metal substrate is provided.

12. A circuit device according to claim 1, wherein a volume $V[m^3]$ of the regions, in said metal substrate, where said first element is provided, satisfies:

$$V > Q/(\rho \cdot C \Delta Tth)$$

where Q [J] is an amount of heat generated by power loss during an energization of said first circuit element, $\rho$ [kg/m$^3$] is density of the region, C[J/kg·K] is a specific heat of the region, and $\Delta Tth[K]$ is an upper limit of temperature variation where no fault of a system results from heat generation of said first circuit element.

13. A circuit device according to claim 1, wherein a volume $V[m^3]$ of the regions, in said metal substrate, where said first element is provided, satisfies:

$$V > Q/(\rho \cdot C \cdot \Delta Tth)$$

where Q [J] is an amount of heat generated by power loss during an energization of said first circuit element, $\rho$ [kg/m$^3$] is density of the region, C[J/kg·K] is a specific heat of the region, and $\Delta Tth[K]$ is an upper limit of temperature variation where no fault of a system results from heat generation of said first circuit element.

14. A circuit device according to claim 11, wherein a volume $V[m^3]$ of the regions, in said metal substrate, where said first element is provided, satisfies:

$$V > Q/(\rho \cdot C \cdot \Delta Tth)$$

where Q [J] is an amount of heat generated by power loss during an energization of said first circuit element, $\rho$ [kg/m$^3$] is density of the region, C[J/kg·K] is a specific heat of the region, and $\Delta Tth[K]$ is an upper limit of temperature variation where no fault of a system results from heat generation of said first circuit element.

15. A fan motor system, comprising:
a fan motor;
a circuit device, according to claim 1, which drives said fan motor.

16. A fan motor system, comprising:
a fan motor;
a circuit device, according to claim 6, which drives said fan motor.

17. A fan motor system, comprising:
a fan motor;
a circuit device, according to claim 11, which drives said fan motor.

18. A fan motor system, comprising:
a fan motor;
a circuit device, according to claim 12, which drives said fan motor.

19. A fan motor system, comprising:
a fan motor;
a circuit device, according to claim 13, which drives said fan motor.

* * * * *